United States Patent
Bolsinger

(10) Patent No.: US 10,627,458 B2
(45) Date of Patent: Apr. 21, 2020

(54) OMNIPOLAR SCHMITT TRIGGER

(71) Applicant: Allegro MicroSystems, LLC, Manchester, NH (US)

(72) Inventor: Pablo Javier Bolsinger, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 283 days.

(21) Appl. No.: 15/714,067

(22) Filed: Sep. 25, 2017

(65) Prior Publication Data
US 2019/0094313 A1 Mar. 28, 2019

(51) Int. Cl.
| | |
|---|---|
| G01R 33/07 | (2006.01) |
| G01B 7/02 | (2006.01) |
| H01L 43/06 | (2006.01) |
| G01R 33/09 | (2006.01) |
| G01R 33/00 | (2006.01) |
| H01H 36/00 | (2006.01) |

(52) U.S. Cl.
CPC ........... *G01R 33/072* (2013.01); *G01B 7/023* (2013.01); *G01R 33/0023* (2013.01); *G01R 33/091* (2013.01); *H01H 36/00* (2013.01); *H01L 43/065* (2013.01)

(58) Field of Classification Search
CPC .... G01B 7/023; G01R 33/0023; G01R 33/07; G01R 33/072; G01R 33/091; H01H 36/00; H01L 43/065
USPC ........... 324/117 R, 207.11–207.26, 251, 244, 324/260; 327/205
See application file for complete search history.

(56) References Cited

U.S. PATENT DOCUMENTS

| | | | | |
|---|---|---|---|---|
| 5,844,427 | A * | 12/1998 | Theus | G01D 5/142 327/51 |
| 6,356,741 | B1 | 3/2002 | Bilotti et al. | |
| 6,622,012 | B2 | 9/2003 | Bilotti et al. | |
| 6,777,932 | B2 * | 8/2004 | Hara | G01R 33/07 324/117 R |
| 7,085,119 | B2 | 8/2006 | Bilotti et al. | |
| 7,307,824 | B2 | 12/2007 | Bilotti et al. | |
| 7,737,688 | B2 * | 6/2010 | Tomida | G01R 33/07 324/251 |
| 8,063,629 | B2 * | 11/2011 | Hackner | G01R 33/07 324/207.25 |
| 9,664,752 | B2 | 5/2017 | Monreal et al. | |

(Continued)

*Primary Examiner* — Steven L Yeninas
(74) *Attorney, Agent, or Firm* — Daly, Crowley, Mofford & Durkee LLP

(57) ABSTRACT

A sensor is provided having a magnetic field sensing element to generate a magnetic field signal, a switching circuit coupled to receive the magnetic field signal and generate a switching signal that changes a polarity of the magnetic field signal at a predetermined frequency, and a comparison device configured to receive the switching signal and generate an output signal that changes a level in response to the switching signal crossing a predetermined threshold. The switching circuit is disposed between the magnetic field sensing element and the comparison device and can provide the comparison device an input signal (i.e., the switching signal) that changes polarity at the predetermined frequency. The comparison device can sense characteristics, such as but not limited to crossing operate and release threshold levels, of both north and south polarity magnetic field signals using the switching signal.

23 Claims, 6 Drawing Sheets

(56) References Cited

U.S. PATENT DOCUMENTS

| | | | |
|---|---|---|---|
| 9,733,106 B2 | 8/2017 | Judkins, III et al. | |
| 2003/0020470 A1* | 1/2003 | Hatanaka | G01D 3/02 |
| | | | 324/251 |
| 2003/0102909 A1* | 6/2003 | Motz | G01R 33/07 |
| | | | 330/9 |
| 2009/0009273 A1* | 1/2009 | Ku | G01R 33/072 |
| | | | 335/78 |
| 2012/0249124 A1* | 10/2012 | Ionescu | G01R 33/072 |
| | | | 324/207.2 |
| 2016/0200245 A1 | 7/2016 | Rivas et al. | |

* cited by examiner

OMNIPOLAR SCHMITT TRIGGER

BACKGROUND

As is known, magnetic switch sensors are used to detect proximity of a target to one or more magnetic field sensing elements of the sensor, which target and sensor are capable of motion relative to one another. Example devices may include a stationary portion to which the sensor is attached and a movable portion including a magnet, such as cellular telephones and laptop computers having magnets in moveable door or cover portions.

Some magnetic switch sensors are capable of detecting proximity of a magnetic target regardless of the orientation of the magnetic poles of the magnet relative to the sensor, a capability sometimes referred to as "omnipolar" operation. One such sensor is described in a U.S. Pat. No. 7,307,824, entitled "Magnetic Pole Insensitive Switch Circuit", which patent issued on Dec. 11, 2007 and is assigned to the Assignee of the subject application.

SUMMARY

In accordance with the concepts, systems, methods and techniques described herein, an omnipolar sensor is provided having a magnetic field sensing element configured to generate a magnetic field signal, a switching circuit coupled to receive the magnetic field signal and generate a switching signal that changes a polarity of the magnetic field signal at a predetermined frequency, and a comparison device configured to receive the switching signal and generate an output signal that changes a level in response to the switching signal crossing a predetermined threshold.

The switching circuit can be disposed between the magnetic field sensing element and the comparison device and can provide the comparison device with an input signal (i.e., the switching signal) that changes its polarity at a predetermined frequency. The comparison device can be configured to sense characteristics of the switching signal, such as but not limited to the switching signal crossing operate point and release point threshold levels. With this configuration, the sensors described herein can be configured for omnipolar applications and can detect magnetic fields of either polarity and in any direction using a single comparison device, reducing the size and/or cost of the respective omnipolar sensor as compared with other omnipolar sensing devices.

The components of the omnipolar sensors described herein can be activated and/or de-activated in response to magnetic fields of either polarity crossing predetermined threshold(s) (e.g., greater than, less than) and can generate an output signal having a particular logic level (e.g., logic level high, logic level low) accordingly. For example, the output signal can be coupled to the switching circuit and the switching circuit can be configured to stop switching the polarity of the magnetic field signal in response to a level of the output signal.

In some embodiments, the output signal is provided to the switching circuit through a logic gate. For example, the output signal can be coupled to a first input of the logic gate and a clock signal can be coupled to a second, different input of the logic gate. The clock signal can be used to establish the predetermined frequency at which the switching circuit changes the polarity of the magnetic field signal.

In one embodiment, when an operate point threshold level is reached, the output signal can transition to a first logic level and, responsive to the first logic level, the switching circuit can stop switching the polarity of the magnetic field signal. The output signal can remain at that particular logic level until a release point threshold level is reached. Once the release point threshold level is crossed, the output signal can transition to a second, different level and the switching circuit can begin switching the polarity of the magnetic field signal again and sensing for the switched magnetic field signal to again reach the operate point threshold level.

The predetermined frequency can be selected based at least in part on desired switchpoint characteristics of the respective sensor. The switchpoint characteristics can be equivalent field strengths, but at opposite polarities. Thus, the switching signal can correspond to a chopped version of the received magnetic field signal that transitions between positive and negative polarity values. The comparison device can be coupled to receive the chopped version of the received magnetic field signal that transitions between positive and negative polarity values and determine when magnetic field signals of either polarity cross the predetermined threshold.

In a first aspect, a sensor is provided having a magnetic field sensing element configured to generate a magnetic field signal in response to a sensed magnetic field, a switching circuit coupled to receive the magnetic field signal and generate a switching signal that changes a polarity of the magnetic field signal at a predetermined frequency, and a comparison device coupled to receive the switching signal and generate an output signal that changes a level in response to the switching signal crossing a predetermined threshold. The output signal is coupled to the switching circuit and the switching circuit stops switching the polarity of the magnetic field signal in response to a level of the output signal. In some embodiments, the output signal can be coupled to the switching circuit through a logic gate.

A clock signal can be coupled to an input of the logic gate to establish the predetermined frequency at which the switching circuit changes the polarity of the magnetic field signal. The predetermined threshold level may include an operate threshold level and a release threshold level.

The logic gate may include an AND gate. The comparison device may include a Schmitt trigger. The switching circuit may include one or more transistors. The magnetic field sensing element may include one or more Hall effect elements.

The sensed magnetic field can be indicative of a distance or angle between the magnetic field sensing element and a target.

In another aspect, a sensor includes a magnetic field sensing element configured to generate a magnetic field signal in response to a sensed magnetic field. The sensor further includes a switching circuit coupled to receive the magnetic field signal and generate a switching signal that changes a polarity of the magnetic field signal at a predetermined frequency and a comparison device coupled to receive the switching signal and generate an output signal that changes a level in response to the switching signal crossing a predetermined threshold. The output signal is independent of the polarity of the magnetic field signal and the predetermined threshold is the same regardless of the polarity of the magnetic field signal. In some embodiments, the output signal can be coupled to the switching circuit through a logic gate.

A clock signal can be coupled to an input of the logic gate to establish the predetermined frequency at which the switching circuit changes the polarity of the magnetic field signal. The predetermined threshold level can include an operate threshold level (or operate point threshold level) and a release threshold level (or release point threshold level).

In some embodiments, the magnetic field sensing element, switching circuit and comparison device can be provided in a single integrated circuit. The sensed magnetic field can be indicative of a distance or an angle between the magnetic field sensing element and a target.

In another aspect, a sensor includes means for generating a magnetic field signal indicative of a distance or an angle between the generating means and a target, means for switching a polarity of the magnetic field signal at a predetermined frequency to generate a switching signal, and means for comparing the switching signal to a predetermined threshold to generate an output signal that changes a level in response to the switching signal crossing the predetermined threshold. The output signal is coupled to the switching means to stop the switching means changing the polarity of the magnetic field signal in response to the level of the output signal. In some embodiments, the output signal can be coupled to the switching means through a logic gate.

A clock signal can be coupled to an input of the logic gate to establish the predetermined frequency at which the switching means changes the polarity of the magnetic field signal.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figures 1, 1A:
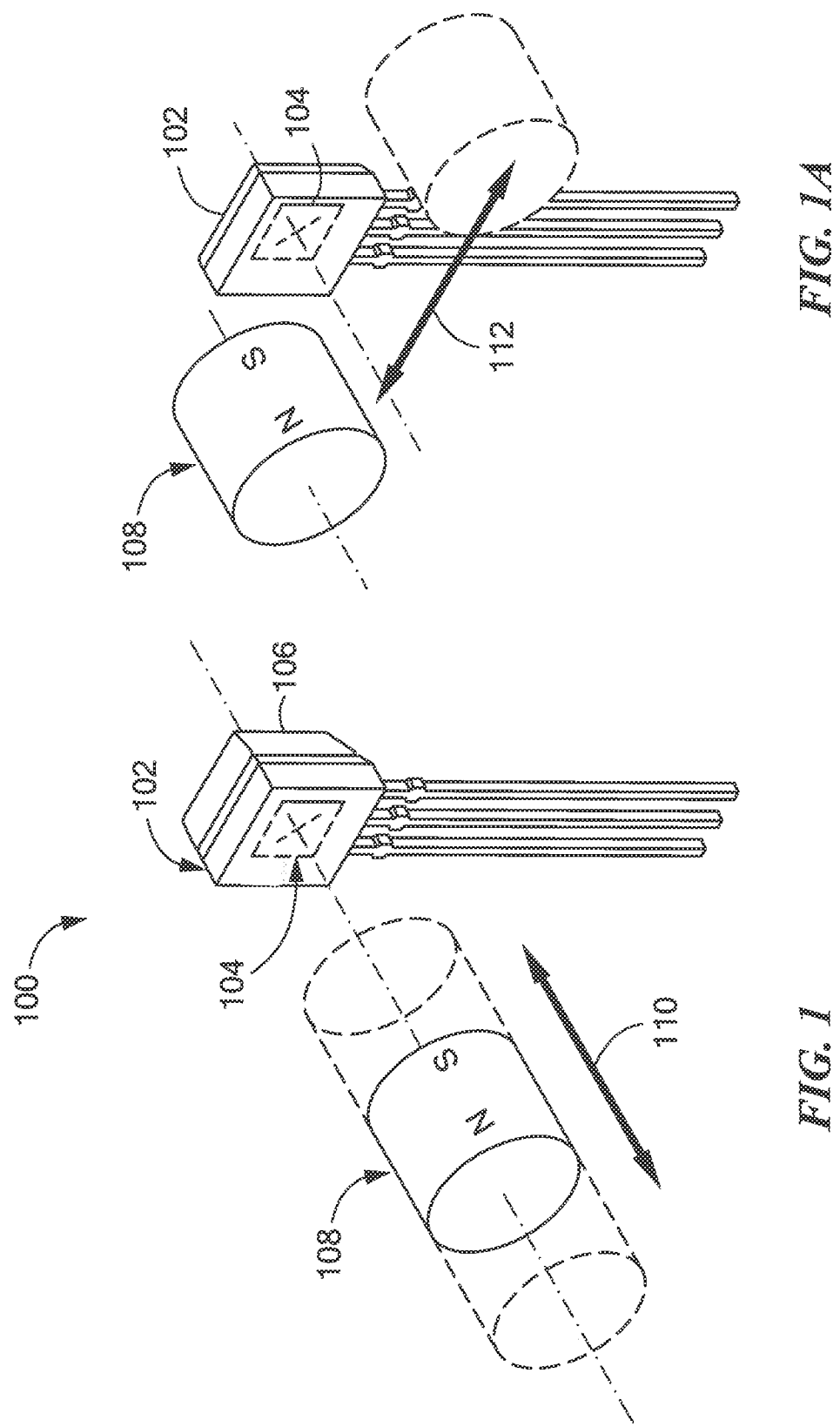
FIG. 1 shows a sensor disposed proximate to a moving target in a "head-on" configuration.
FIG. 1A shows a sensor disposed proximate to a moving target in a "slide by" configuration.
Figure 1C:
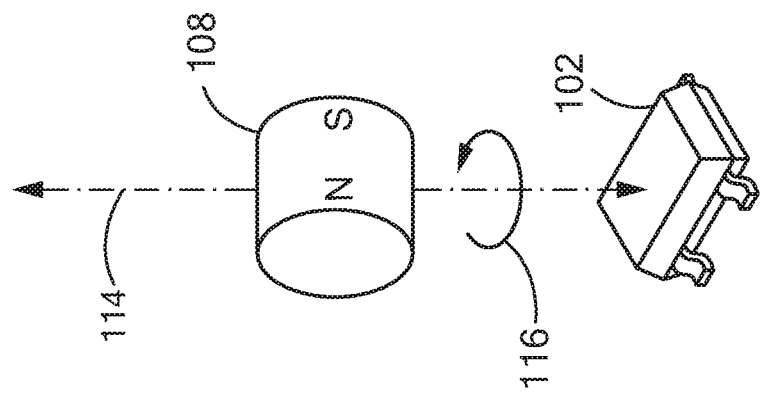
FIG. 1C shows a sensor disposed proximate to a rotating target to detect an angle of the target relative to the sensor.

Now referring to FIGS. 1-1C, in which like reference numerals indicate like elements, a sensor arrangement 100 includes a sensor 102 disposed proximate to a target 108. The sensor 102 includes one or more magnetic field sensing elements 104 positioned to sense a magnetic field generated in response to movement of target 108.

In an embodiment, the sensor 102 may be positioned proximate to, include or be included in various types of human-machine interfaces having mechanical and/or magnetic switch components. In such embodiments, target 108 may be a component of the human-machine interface (e.g., component of a switch) and sensor 102 can be configured to detect a distance and/or angle of target 108 relative to sensor 102 to detect, for example, if the respective switch has been closed and/or opened.

Target 108 may include a magnet (e.g., permanent magnet, electromagnet, etc.) capable of generating a magnetic field or various types of ferromagnetic material capable of affecting a magnetic field. Sensor 102 includes one or more magnetic field sensing elements 104 to detect the proximity and/or angle of a magnetic field associated with target 108. As target 108 moves closer to magnetic field sensing element 104 or into a particular angle with respect to magnetic field sensing element 104, a strength of the magnetic field can increase and a corresponding strength of a magnetic field signal generated by magnetic field sensing element 104 can increase. Thus, the magnetic field sensing element 104 can provide the magnetic field signal to indicate a distance and/or angle of target 108 relative to sensor 102. For example, in one embodiment, the magnetic field signal can be used to determine if a pushbutton or other type of switch associated with the target 108 is open or closed.

Sensor 102 may include a back bias magnet 106. For example, and as stated above, target 108 may include a ferromagnetic element and magnetic field sensing element 102 can be positioned between target 108 and the back bias magnet 106.

The illustrative embodiment of FIG. 1 shows target 108 having a "head-on" configuration with respect to sensor 102, whereby the target moves towards and away from the sensor along an axis 110. However, it should be appreciated that sensor 102 can be configured to sense a variety of different types of motions (e.g., head-on, slide-by, rotation, etc.) to detect a distance and/or angle of target 108 relative to sensor 102. In general, sensor 102 can be configured to sense any relative motion between the target 108 and sensor 102.

For example, and as illustrated in FIG. 1A, target 108 has a "slide-by" configuration with respect to sensor 102 and magnetic field sensing element 104, whereby the sensor 102 is configured to detect proximity of target 108 as it moves along an axis 112. Magnetic field sensing element 104 can provide the magnetic field signal to indicate the distance of target 108 relative to sensor 102.

Figure 1B:
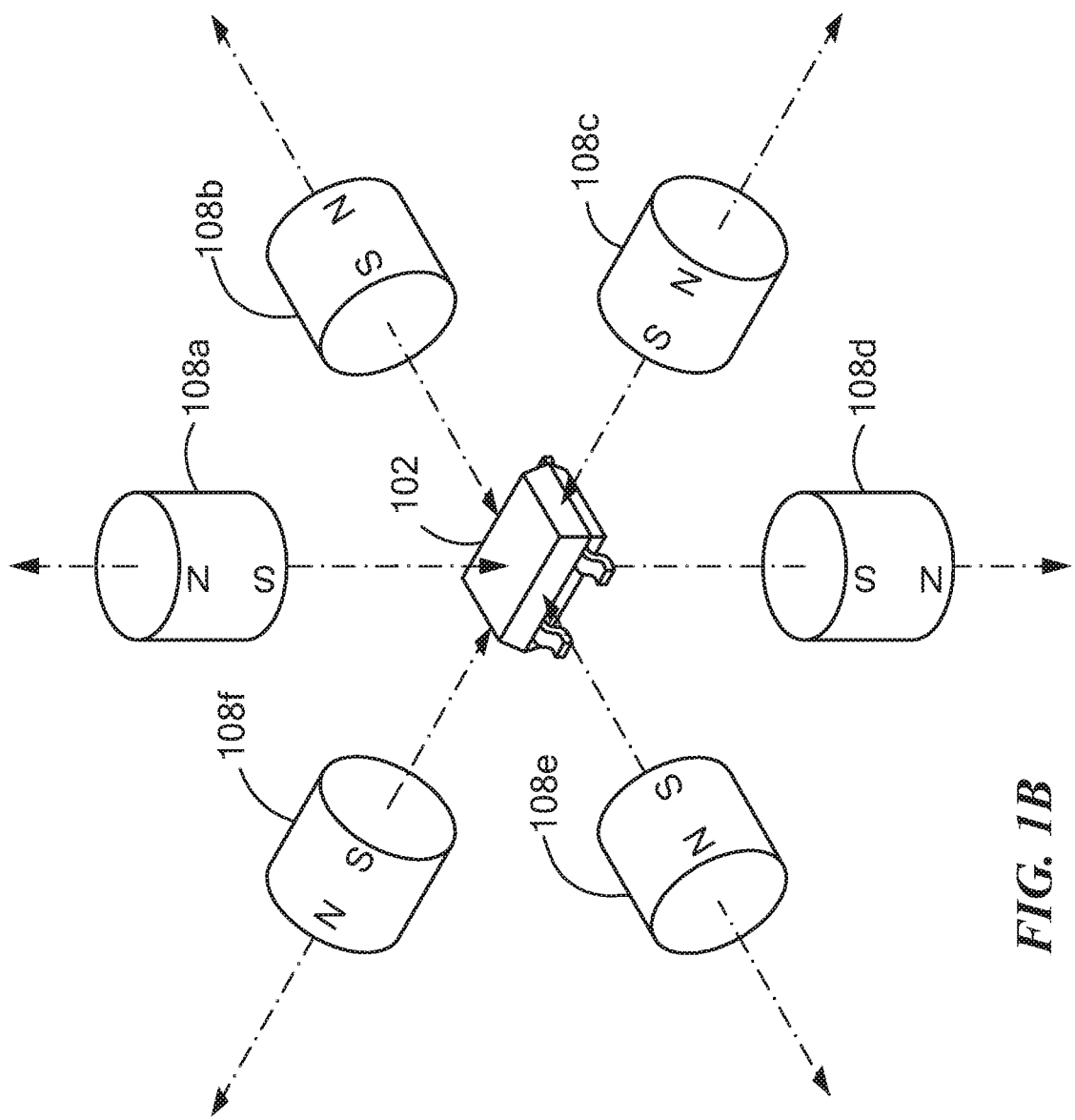
FIG. 1B shows a sensor disposed proximate to targets moving in various directions with respect to the sensor in a "3D" configuration.

It should further be appreciated that magnetic field sensing element 104 can be configured to detect multiple axes of motion and/or alternative axes of motion. For example, and as illustrated in FIG. 1B, a plurality of targets 108a-108f are illustrated movable along multiple respective axes of motion with respect to sensor 102. In an embodiment, sensor 102 and thus magnetic field sensing element 104 can be configured to perform two-dimensional sensing and/or three-dimensional sensing to detect the proximity of one or more targets 108a-108f with respect to sensor 102.

Now referring to FIG. 1C, in some embodiments, magnetic field sensing element 104 can be configured to detect an angle of target 108 relative to sensor 102. For example, target 108 may rotate about an axis 114 as shown by arrow 116. In such an embodiment, the distance from target 108 to sensor 102 may not change, however the angle of target 108 relative to sensor 102 does change and magnetic field sensing element 104 can detect this angle. It should be appreciated that in other embodiments, sensor 102 can be rotated relative to target 108 to detect the angle of target 108 relative to sensor 102.

Magnetic field sensing element 104 may include one or more Hall effect elements and/or one or more magnetoresistance elements. The Hall effect elements may include planar Hall effect elements, vertical Hall effect elements, or Circular Vertical Hall (CVH). The magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

Figure 2:
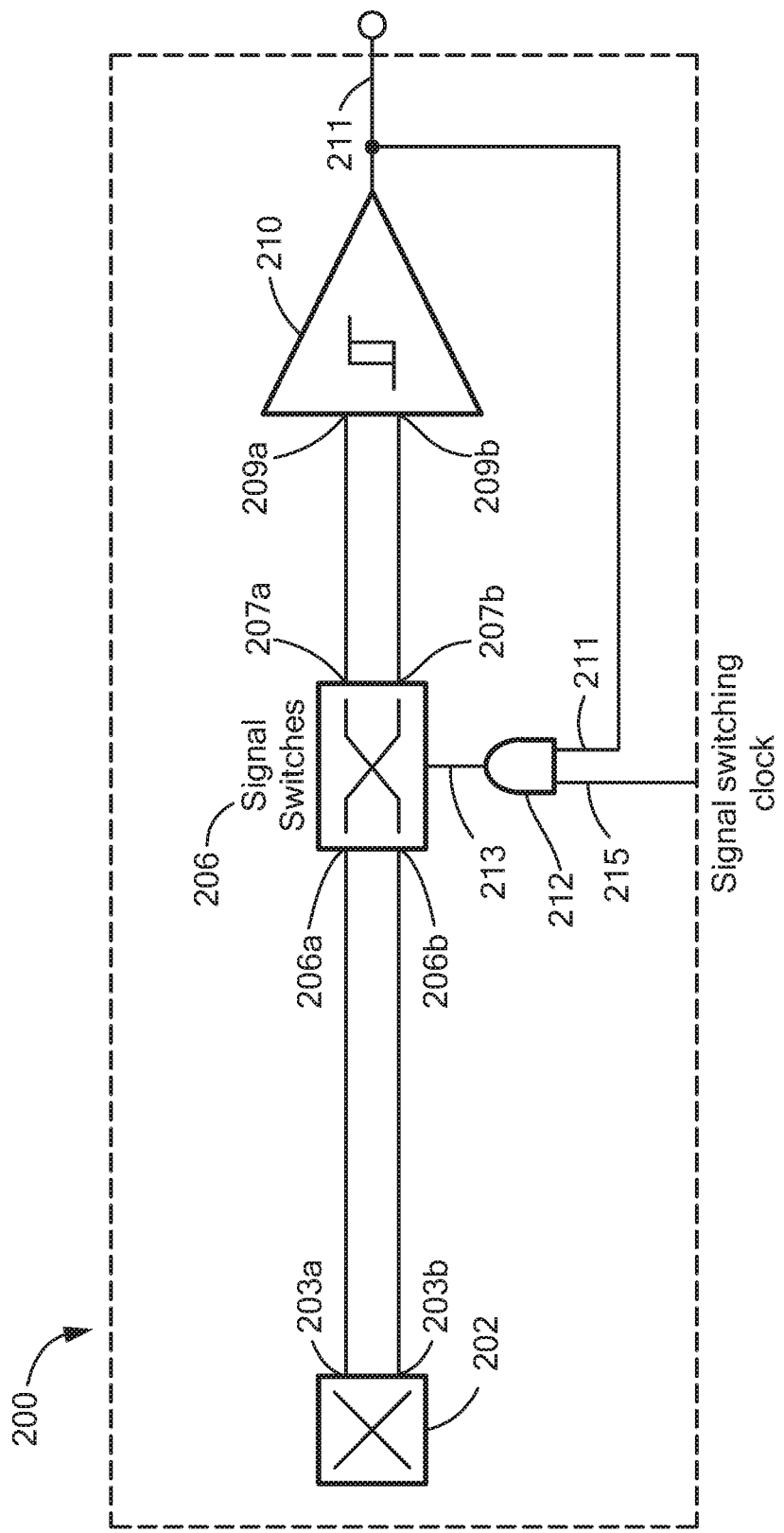
FIG. 2 shows a block diagram of a sensor having a switching circuit disposed between a magnetic field sensing element and a comparison device.

Now referring to FIG. 2, a sensor 200 includes a sensing element 202 having one or more outputs 203a, 203b coupled to inputs of switching circuit 206 and switching circuit 206 having one or more outputs 207a, 207b coupled to inputs of comparator 210 (also referred to herein as a comparison device). In an embodiment, sensor 200 may be the same as of substantially similar to sensor 102 of FIG. 1.

Sensing element 202 may be the same as or substantially similar to sensing element 104 of FIG. 1. Sensing element 202 can be configured to generate a magnetic field signal indicative of a distance or an angle of a target (e.g., target 108 of FIG. 1) relative to sensing element 202.

Output terminals 203a, 203b of sensing element 202 can be coupled to first and second differential inputs 206a, 206b of switching circuit 206. In some embodiments, first input terminal 206a may correspond to a positive input terminal (e.g., positive input terminal 410 of FIG. 4) and second input terminal 206b may correspond to a negative input terminal (e.g., negative input terminal 420 of FIG. 4). First and second inputs 205a, 205b of switching circuit 206 will be described in greater detail below with respect to FIG. 4.

Switching circuit 206 can include one or more transistors, one or more transmission gates, one or more analog switches or a combination of them. Switching circuit 206 will be described in more detail below with respect to FIG. 4.

Switching circuit 206 can receive the magnetic field signal from sensing element 202 and generate a switching signal that changes a polarity of the magnetic field signal at a predetermined frequency. For example, a logic gate 212 (e.g., AND gate) is coupled to a control input of switching circuit 206 to provide a frequency signal 213. In an embodiment, the frequency signal 213 can be configured to establish the predetermined frequency at which switching circuit 206 changes the polarity of the magnetic field signal. The frequency signal 213 can correspond to a clock signal 215 having the predetermined frequency.

As illustrated in FIG. 2, clock signal 215 can be provided to a first input of logic gate 212 and output signal 211 corresponding to an output of sensor 200 can be provided to a second input of logic gate 212. Clock signal 215 can have a frequency corresponding to the predetermined frequency at which switching circuit 206 changes the polarity of the magnetic field signal. The predetermined frequency can be selected based at least in part on an output rate for desired switch point accuracy of a particular application of sensor 200.

Logic gate 212 can be configured to generate frequency signal 213 having a frequency corresponding the frequency of clock signal 215. For example, when the output signal 211 of comparator 210 is at a first logic level, such as a high logic level, logic gate 212 can be configured to provide the frequency signal 213 having the predetermined frequency to switching circuit 206. Responsive to receiving the frequency signal 213 having the predetermined frequency, switching circuit 206 can modify polarity properties of the magnetic field signal received from sensing element 202, as will be described in greater detail below with respect to FIGS. 3-3A.

When the output signal 211 of comparator 210 is at a second, different logic level, such as a low logic level, logic gate 212 can be configured to provide the frequency signal 213 at a logic low level to switching circuit 206 to thereby cause switching circuit 206 to stop switching the polarity of the magnetic field signal received from sensing element 202.

First and second outputs 207a, 207b of switching circuit 206 are coupled to first and second differential inputs 209a, 209b of comparator 210 to provide the switching signal. In some embodiments, first output terminal 207a may correspond to a positive output terminal (e.g., positive output terminal 412 of FIG. 4) and second output terminal 207b may correspond to a negative output terminal (e.g., negative output terminal 422 of FIG. 4). First and second outputs 207a, 207b of switching circuit 206 will be described in greater detail below with respect to FIG. 4.

Comparator 210 can be configured to generate output signal 211 that transitions between a first level and a second, different level (e.g., transitions between a logic high level and a logic low level) in response to the switching signal crossing a predetermined threshold.

As stated above, output signal 211 is coupled to switching circuit 206 through logic gate 212 and switching circuit 206 can be configured to stop switching the polarity of the magnetic field signal in response to a particular level of output signal 211. In an embodiment, sensor 200 can be configured for omnipolar sensing applications. For example, sensor 200 can be configured to detect magnetic fields of north and/or south polarity crossing various threshold levels.

Figure 3:
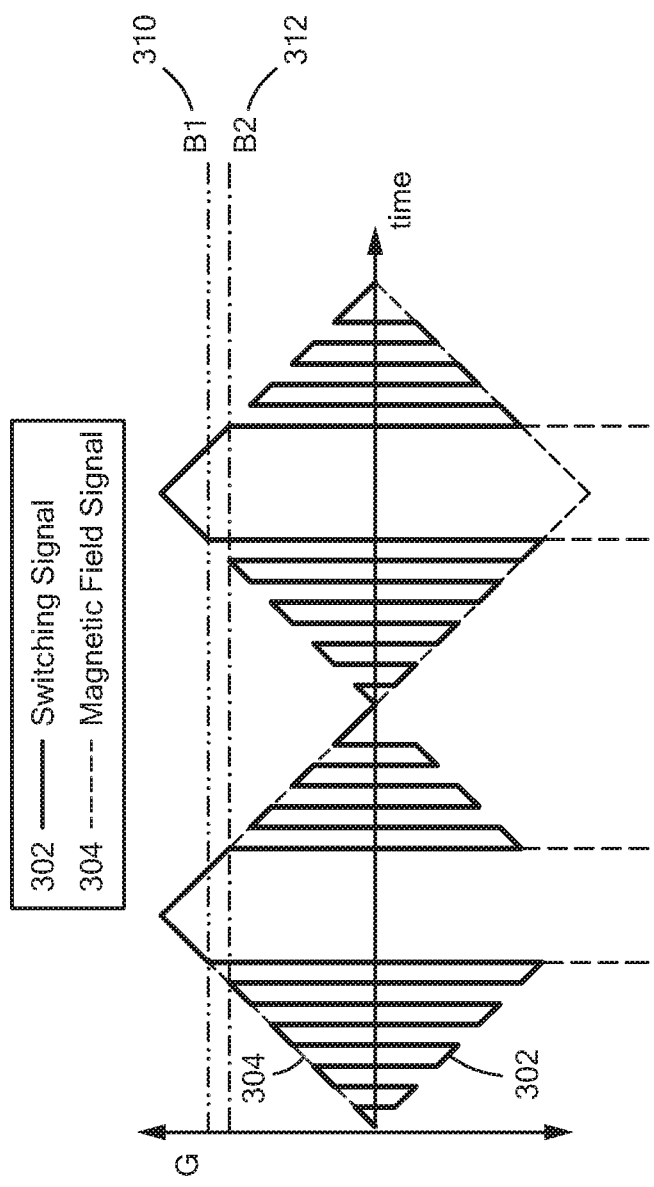
FIG. 3 shows a plot illustrating the use of a switching circuit to modify the polarity of a magnetic field signal and generate a switching signal by illustrating the relationship between the magnetic field signal provided to the switching circuit and the switching signal generated by the switching circuit in response to the magnetic field signal.
Figure 3A:
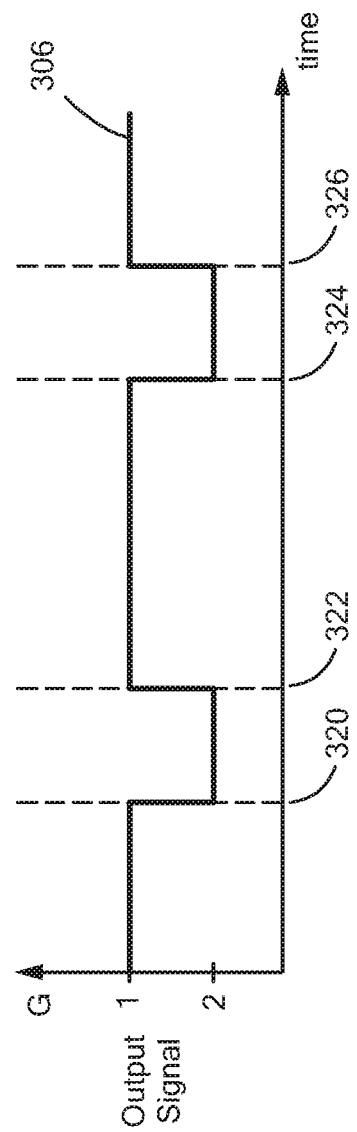
FIG. 3A shows a plot of an output signal generated based on the switching signal of FIG. 3.

Now referring to FIGS. 3-3A, plots of an example magnetic field signal 304 (FIG. 3) generated by a magnetic field sensing element (e.g., sensing element 202 of FIG. 2) in response to movement of a target (e.g., target 108 of FIG. 1), the corresponding switching signal 302 (FIG. 3) generated by a switching circuit (e.g., switching circuit 206 of FIG. 2, switching circuit 400 of FIG. 4), and the corresponding output signal 306 (FIG. 3A) generated by a comparator (e.g., comparator 210 of FIG. 2) are provided.

FIG. 3 illustrates magnetic field signal 304 corresponding to movement of the target relative to a magnetic field sensing element. As the target approaches the magnetic field sensing element, a level (e.g., strength) of the magnetic field signal increases and as the target moves away from the magnetic field sensing element, the level of the magnetic field signal decreases. In an embodiment, the sensing element can be configured for omnipolar sensing applications and can be responsive to magnetic fields of both north and south polarities. Thus, the magnetic field signal 304 can include north and south polarity properties. For example, in some embodiments, the magnetic field signal 304 can be positive for a positive sensed magnetic field and negative for a negative sensed magnetic field.

The magnetic field signal 304 can be provided to a switching circuit than can be configured to generate switching signal 302 in response to magnetic field signal 304. In particular, the switching circuit can be configured to transition the polarity of magnetic field signal 304 between positive and negative polarities at a predetermined frequency to generate switching signal 302.

For example, and as illustrated in FIG. 3, switching signal 302 can alternate between positive values and negative values, which correspond to south and north polarity values respectively, at the predetermined frequency to generate a chopped version of magnetic field signal 304. In other embodiments, positive values can correspond to north polarity values and negative values can correspond to south polarity values.

Once a threshold level is reached (e.g., first threshold level 310, second threshold level 312), switching circuit can stop changing the polarity of magnetic field signal 304, thus switching signal 302 can stop alternating between positive values and negative values. In an embodiment, the switching circuit can be configured to stop switching the polarity of magnetic field signal 304 responsive to output signal 306 changing to a particular logic level.

In embodiments, the threshold level may include one or more threshold values 310, 312. In the illustrative embodiment of FIG. 3, the threshold includes a first threshold level B1, 310 (e.g., operate point threshold level) and second threshold level B2, 312 (release threshold level), as may be implemented by hysteresis of the comparator 210. In an embodiment, the first threshold level B1 310, (or operate point threshold level) may correspond to the level of an increasing magnetic field at which a sensing element (e.g., sensing element 104 of FIG. 1, sensing element 202 of FIG. 2) is activated and the second threshold level B2 312 (or release point threshold level) may correspond to the level of a decreasing magnetic field at which a sensing element (e.g., sensing element 104 of FIG. 1, sensing element 202 of FIG. 2) is de-activated. It should be appreciated that in other embodiments, the threshold level may be one threshold level (i.e., one value) or even more than two threshold levels.

The magnetic field signal 304 increases and reaches the first threshold level 310 (e.g., in a first direction) at a first time 320. Also at time 320, switching signal 302 can increase and reach the first threshold level 310. Responsive to the switching signal 302 crossing the first threshold level 310 at time 320, the output signal 306 may transition from a first level to a second, different level (i.e., change state). In some embodiments, the output signal 306 can be coupled to or otherwise provided to the switching circuit generating switching signal 302 and thus, switching signal 302 can be configured to stop switching the polarity of magnetic field signal 304 responsive to the output signal changing level. Thus, between time 320 and time 322, switching signal 302 can maintain its polarity (here positive) and generally follow magnetic field signal 304.

Responsive to the switching signal 302 crossing the second threshold level 312 at a time 322, output signal 306 may transition from the second level to the first level (i.e., change state). Responsive to output signal 306 transitioning from the second level to the first level, the switching signal 302 can begin changing the polarity of magnetic field signal 304 and thus alternating between positive and negative values at the predetermined frequency.

At a time 324, the values of magnetic field signal 304 can be negative and have an absolute value approaching the first threshold level 310 a second time. As switching signal 302 transitions between positive and negative values, switching signal 302 can cross the first threshold level 310 a second time to indicate that the absolute value of magnetic field signal 304 is crossing the first threshold level 310. Responsive to the switching signal 302 crossing the first threshold level 310, the output signal 306 may transition from the first level to the second level (i.e., change state). In an embodiment, the switching signal 302 allows the same threshold levels 310, 312 to be used for both north and south polarity values of magnetic field signal 304.

In response to the output signal 306 transitioning from the first level to the second level, switching signal 302 can stop changing the polarity of magnetic field signal 304. Thus, between time 324 and a time 326, switching signal 302 can maintain its polarity (here positive) and generally follow an inverse version of magnetic field signal 304.

At time 326, the values of magnetic field signal 304 can still be negative and have an absolute value approaching the second threshold level 312 a second time. Switching signal 302 can transition between positive and negative values and cross the second threshold level 312 at time 326. In response to the switching signal 302 crossing the second threshold level 312, the output signal 306 may transition from the second level to the first level (i.e., change state). In response to the output signal 306 transitioning from the second level to the first level, switching signal 302 can begin changing the polarity of magnetic field signal 304. This signal behavior may be repeated for the operation of the respective sensor.

In this way, the comparator (or comparison device) is provided with an input signal, here switching signal 302, that changes its polarity at the predetermined frequency and therefore provides for sensing both north and south magnetic field polarities. Once an operate point threshold level, here first threshold level 310, is reached and the comparator output signal 306 changes its respective level, the switching of magnetic field signal 304 is stopped as that corresponds to the polarity of the magnetic field signal applied to the sensing element (e.g., sensing element 202 of FIG. 2). The switching circuit can remain in that particular polarity (e.g., continue not switching magnetic field signal 304) until a release threshold level, here second threshold level, is reached. Responsive to the release threshold level being reached, the comparator output signal 306 changes its respective level and the switching circuit can begin switching the polarity of magnetic field signal 304 again and thus sensing for north and/or south magnetic field polarities.

Figure 4:
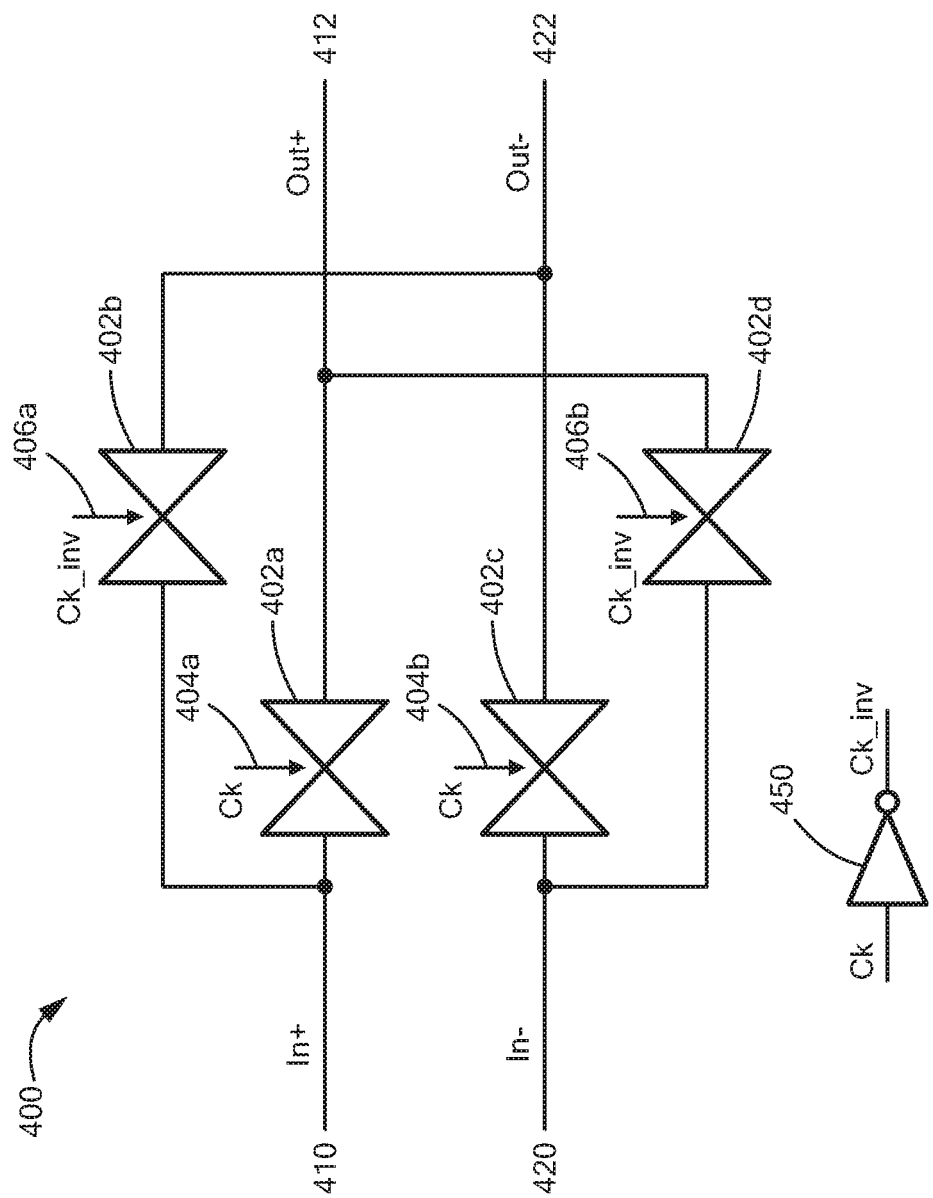
FIG. 4 is a circuit diagram of a switching circuit.

Now referring to FIG. 4, a switching circuit 400 is provided. Switching circuit 400 may be the same as or substantially similar to switching circuit 206 of FIG. 2.

Switching circuit 400 includes multiple switching elements 402a-402d. Each of switching elements 402a-402d can be configured to selectively block or transmit a signal from their respective input to their respective output based on an applied control signal (e.g., clock signal). For example, switching elements 402a-402d can be arranged within switching circuit 400 to selectively modify a polarity of a received magnetic field signal (e.g., magnetic field signal 304 of FIG. 3) to generate a switching signal (e.g., switching signal 302 of FIG. 3) that transitions between positive and negative values (e.g., switches from between south and north polarity values) at a predetermined frequency of an applied clock signal (e.g., clock signal 215 of FIG. 2 or frequency signal 213 of FIG. 2). In an embodiment, the switching signal may correspond to a chopped version of the received magnetic field signal.

As illustrated in FIG. 4, first switching element 402a and second switching element 402b are coupled to receive the magnetic field signal from a positive magnetic field signal input terminal 410. Third switching element 402c and fourth switching element 420d are coupled to receive the magnetic field signal from a negative magnetic field signal input terminal 420.

First and third switching elements 402a, 402c are coupled to receive a clock signal through clock inputs 404a, 404b respectively. Second and fourth switching element 402b, 402d are coupled to receive the clock signal through inverses clock inputs 406a, 406b respectively. In an embodiment, inverse clock inputs 406a, 406b may include a logic gate (e.g., inverter 450) to invert a value of the clock signal such that the clock signal provided at inverse clock inputs 406a, 406b is opposite polarity (i.e., inverse) of the clock signal provided at clock inputs 404a, 404b. For example, when a clock signal is logic level high, the clock signal provided at clock inputs 404a, 404b is logic level high, and the clock signal provided at inverse clock inputs 406a, 406b is logic level low. When a clock signal is logic level low, the clock signal provided at clock inputs 404a, 404b is logic level low, and the clock signal provided at inverse clock inputs 406a, 406b is logic level high.

In operation, switching elements 402a-402d can be arranged to switch between providing a differential input signal (e.g., received magnetic field signal) between positive and negative output terminals 412, 422 or between negative and positive output terminals 422, 412, thereby generating a switching signal across output terminals 412, 422 that is either the same as the input signal across input terminals 410, 420 or is the inverse polarity of the input signal that transitions between positive and negative values at the predetermined frequency of a clock signal (e.g., clock signal 215 of FIG. 2 or frequency signal 213 of FIG. 2).

For example, when the clock signal is logic high, the first switching element 402a can pass its respective input to positive output 412 and second switching element 402b can be configured to block any received signal. Also, when the clock signal is logic high, the third switching element 402c can pass its respective input to negative output 422 and fourth switching element 402d can be configured to block any received signal. In this configuration, the differential input signal across input terminals 410, 420 is coupled to output terminals 412, 422 through closed switches 402a, 402c as a same polarity signal. When the clock signal is logic low, the first switching element 402a can be configured to block any received signal and second switching element 402b can pass its respective input to negative output 422. Also, when the clock signal is logic low, the third switching element 402c can be configured to block any received signal and fourth switching element 402d can pass its respective input to positive output 412. In this configuration, the differential input signal across input terminals 410, 420 is provided as an opposite polarity signal (switched signal) at output terminals 412, 422 since input 410 is coupled to output 422 and input 420 is coupled to output 412.

In this way, the generated switching signal transitions between positive and negative values at the predetermined frequency of the clock signal applied to switching elements 402a-402d. In an embodiment, the switching signal can be provided as an input signal for a comparator, such as comparator 210 of FIG. 2.

The switching elements 402a-402d may one or more transistors, such as but not limited to P-type metal-oxide-semiconductor (PMOS) transistors and/or N-type metal-oxide-semiconductor (NMOS) transistors. In one embodiment, switching elements 402a-402d may be provided as transmission gates and include at least one PMOS transistor and at least one NMOS transistor. In other embodiments, other types of analog switching elements may be used in place or one or more of switching elements 402a-402d to generate a switching signal.

It should be appreciated that switching circuit 400 is one example embodiment of a switching circuit to generate a switching signal (e.g., switching signal 302 of FIG. 3) for omnipolar sensing applications. In some embodiments, one or more components of switching circuit 400 can be omitted and/or replaced with other known circuit components having similar characteristics to generate a switching signal. In an embodiment, the components of switching circuit 400 can be re-arranged (e.g., disposed at different positions and coupled to different components) within switching circuit 400 to generate the switching signal.

Figure 5:
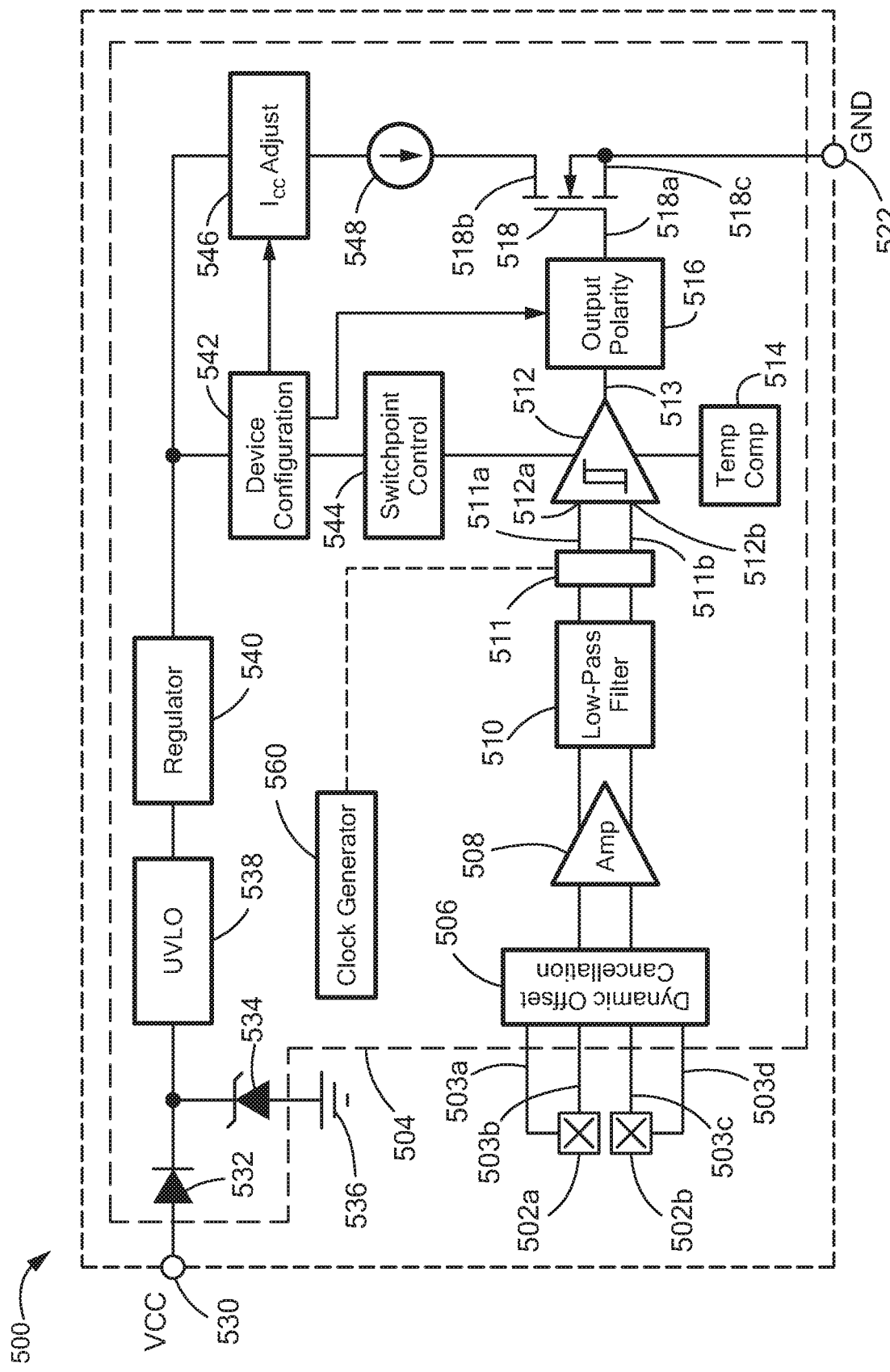
FIG. 5 is a circuit diagram of a sensor.

Now referring to FIG. 5, a sensor 500 includes magnetic field sensing elements 502a, 502b coupled to a circuit 504. Sensor 500 may be the same as or substantially similar to sensor 102 of FIG. 1 or integrated circuit sensor 200 of FIG. 2.

Magnetic field sensing elements 502a, 502b may include one or more Hall effect elements or other types of magnetic field sensing elements. The magnetic field signal provided by magnetic field sensing elements 502a, 502b may be indicative of a distance or an angle between magnetic field sensing elements 502a, 502b and a target object (e.g., target 108 of FIG. 1). Magnetic field sensing elements 502a, 502b can be coupled to various components of circuit 504 for signal processing to generate a sensor output signal indicative of the distance or an angle between magnetic field sensing elements 502a, 502b and the target object. It should be appreciated that although FIG. 5 shows two magnetic field sensing elements 502a, 502b, in other embodiments one magnetic field sensing element or more than two magnetic field sensing elements may be coupled to circuit 504 to provide one or more magnetic field signals.

Magnetic field sensing elements 502a, 502b may have one or more terminals 503a-503d (here four) coupled to a dynamic offset cancellation module 506 to reduce an offset (e.g., provide trimming and/or chopping) associated with the magnetic field signal. The dynamic offset cancellation module 506 is coupled to an amplifier 508, which amplifier 508 is coupled to a low pass filter 510. Low pass filter 510 is coupled to an input of a switching circuit 511. Switching circuit 511 may be the same as or substantially similar to switching circuit 206 of FIG. 2 or switching circuit 400 of FIG. 4. In an embodiment, switching circuit 511 can receive the processed magnetic field signal and generate a switching signal (e.g., switching signal 302 of FIG. 3) that changes a polarity of the processed magnetic field signal at a predetermined frequency.

Switching circuit 511 may have two outputs, a positive output 511a (e.g., positive output 412 of FIG. 4) and a negative output 511b (e.g., negative output 422 of FIG. 4), coupled to a first input 512a and a second input 512b of a comparator (e.g., Schmitt trigger with hysteresis) 512. Comparator 512 (also referred to herein as a comparison device) may be the same or substantially similar to comparator 210 of FIG. 2. In some embodiments, comparator 512 may include switching circuit 511 and its corresponding switching logic. Comparator 512 can be coupled to receive the switching signal from switching circuit 511 and generate an output signal 513 (e.g., output signal 306 of FIG. 3) that changes a level in response to the switching signal crossing a predetermined threshold. In some embodiments, the output signal 513 can be coupled to switching circuit 511.

Comparator 512 can be coupled to receive the switching signal representing positive and negative values of the processed magnetic field signal. Comparator 512 can be configured to detect when the comparator input signal crosses one or more thresholds, such as but not limited to operate point thresholds and/or release point thresholds. In one embodiment, and as illustrated in FIG. 5, a single comparator 512 can be configured to process and detect when the same operate point threshold and/or release point threshold have been crossed by the switching signal regardless of whether the sensed magnetic field has a positive or negative polarity.

A temperature module 514 can be coupled to comparator 512 to provide a temperature compensation signal to provide compensation corresponding to a change in temperature in an environment around circuit 504.

An output of comparator 512 is coupled to provide output signal 513 to an input of a polarity module 516. Polarity module 516 can be configured to permit user selection of output signal polarity (i.e., whether the sensor output signal is an active high signal or an active low signal).

An output of polarity module 516 is coupled to an output driver as may take the form of a transistor 518. More particularly, the sensor 500 may be a so-called two wire part in which an output signal is provided as a current superimposed on the power connection terminals 530, 522.

In some embodiments, transistor 518 includes an n-channel metal oxide semiconductor field effect transistor (MOSFET). In such an embodiment, first terminal 518a corresponds to a gate terminal, second terminal 518b corresponds to a drain terminal and third terminal 518c corresponds to a source terminal. Output terminals 520a, 520b can provide an output signal of the sensor 500 indicative of the distance or an angle between magnetic field sensing elements 502a, 502b and a target.

A power supply terminal 530 is coupled to circuit 504 through a first terminal (i.e., anode) of a diode 532. A second terminal (i.e., cathode) of diode 532 is coupled to an input of an undervoltage lockout (UVLO) module 538. In some embodiments, a Zener diode 534 can be coupled between diode 532 and UVLO module 538. For example, and as illustrated in FIG. 5, a first terminal (i.e., anode) of Zener diode 534 is coupled to a reference potential 536 (e.g., ground) and a second terminal (i.e., cathode) of Zener diode 534 is coupled to second terminal of diode 532. UVLO module 530 can be configured to monitor a voltage provided at power supply terminal 530. In some embodiments, UVLO module 538 can be configured to turn off power to circuit 504 in response to a voltage provided by power supply terminal 530 falling below a predetermined threshold.

An output of UVLO module 538 is coupled to a regulator 540. Regulator 540 can be coupled to provide a power signal to a configuration module 542 (or device configuration 542) with which various circuit parameters can be selected, or configured. Circuit configuration can be preset or predetermined, can be factory implemented during manufacture, or can permit user configuration. In some embodiments, configuration module 542 can include an electrically erasable programmable read-only memory (EEPROM) module that different parameters can be stored and selected from, such as but not limited to current (Icc) output levels, operate point threshold (Bop) values, release point threshold (Brp) values, hysterisis values, output polarities, etc. Configuration module 542 and a current adjust module 546, as may adjust a current level of the sensor output signal.

Configuration module 542 is coupled to an input of a switchpoint control module 544, an input of polarity module 516 and an input of current adjust module 546. Switch point control module 544 can be used to control the threshold level(s) to which comparator 512 compares the switching signal.

As indicated above, in some embodiments, comparator 512 may include switching circuit 511. In such embodiments, switchpoint control module 544 can be coupled to comparator 512 to provide clock signals and/or other logic controls associated with switching circuit 511.

Polarity module 516 can be coupled to receive a configuration signal from configuration module 542.

Current adjust module 546 can be coupled to receive a configuration signal from configuration module 542 and a power signal from regulator 540 and be configured to modify a current corresponding to the power signal. An output of current adjust module 546 is coupled to an input of a current source 548. An output of current source 548 is coupled to the second terminal 518b of transistor 518.

In an embodiment, sensor 500 can be implemented as an integrated circuit having magnetic field sensing elements 502a, 502b and the components of circuit 504 provided in a single integrated circuit. Sensor 500 can be implemented as an integrated circuit containing one or more die such as semiconductor die to support the various elements.

It should be appreciated that the arrangement of components within sensor 500 of FIG. 5 is one example embodiment of a circuit to generate a switching signal and output signal for omnipolar sensing applications and that the components of sensor 500 can be re-arranged (e.g., disposed at different positions and coupled to different components) within sensor 500 to generate the switching signal and output signal 513. In some embodiments, one or more components of sensor 500 can be omitted and/or replaced with other known circuit components to generate the switching signal and output signal 513.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A sensor comprising:
   a magnetic field sensing element configured to generate a magnetic field signal in response to a sensed magnetic field;
   a switching circuit coupled to receive the magnetic field signal and generate a switching signal that changes a polarity of the magnetic field signal at a predetermined frequency; and
   a comparison device coupled to receive the switching signal and generate an output signal that changes a level in response to the switching signal crossing a predetermined threshold, wherein the output signal is coupled to the switching circuit and wherein the switching circuit stops switching the polarity of the magnetic field signal in response to a level of the output signal.

2. The sensor of claim 1, wherein the output signal is coupled to the switching circuit through a logic gate.

3. The sensor of claim 2, wherein the logic gate comprises an AND gate.

4. The sensor of claim 2, further comprising a clock signal coupled to an input of the logic gate to establish the predetermined frequency at which the switching circuit changes the polarity of the magnetic field signal.

5. The sensor of claim 1, wherein the predetermined threshold level comprises an operate threshold level and a release threshold level.

6. The sensor of claim 1, wherein the comparison device comprises a Schmitt trigger.

7. The sensor of claim 1, wherein the switching circuit comprises a transistor.

8. The sensor of claim 1, wherein the magnetic field sensing element comprises one or more Hall effect elements.

9. The sensor of claim 1, wherein the sensed magnetic field is indicative of a distance or an angle between the magnetic field sensing element and a target.

10. A sensor comprising:
    a magnetic field sensing element configured to generate a magnetic field signal in response to a sensed magnetic field;
    a switching circuit coupled to receive the magnetic field signal and generate a switching signal that changes a polarity of the magnetic field signal at a predetermined frequency; and
    a comparison device coupled to receive the switching signal and generate an output signal that changes a level in response to the switching signal crossing a predetermined threshold, wherein the output signal is independent of the polarity of the magnetic field signal and wherein the predetermined threshold is the same regardless of the polarity of the magnetic field signal.

11. The sensor of claim 10, wherein the output signal is coupled to the switching circuit through a logic gate.

12. The sensor of claim 11, wherein the logic gate comprises an AND gate.

13. The sensor of claim 11, further comprising a clock signal coupled to an input of the logic gate to establish the predetermined frequency at which the switching circuit changes the polarity of the magnetic field signal.

14. The sensor of claim 10, wherein the predetermined threshold level comprises an operate threshold level and a release threshold level.

15. The sensor of claim 10, wherein the comparison device comprises a Schmitt trigger.

16. The sensor of claim 10, wherein the switching circuit comprises a transistor.

17. The sensor of claim 10, wherein the magnetic field sensing element comprises one or more Hall effect elements.

18. The sensor of claim 10, wherein the magnetic field sensing element, switching circuit and comparison device are provided in a single integrated circuit.

19. The sensor of claim 10, wherein the sensed magnetic field is indicative of a distance or an angle between the magnetic field sensing element and a target.

20. A sensor comprising:
    means for generating a magnetic field signal indicative of a distance or an angle between the generating means and a target;
    means for switching a polarity of the magnetic field signal at a predetermined frequency to generate a switching signal; and
    means for comparing the switching signal to a predetermined threshold to generate an output signal that changes a level in response to the switching signal crossing the predetermined threshold, wherein the output signal is coupled to the switching means to stop the switching means changing the polarity of the magnetic field signal in response to the level of the output signal.

21. The sensor of claim 20, wherein the output signal is coupled to the switching means through a logic gate.

22. The sensor of claim 21, wherein the logic gate comprises an AND gate.

23. The sensor of claim 21, further comprising a clock signal coupled to an input of the logic gate to establish the predetermined frequency at which the switching means changes the polarity of the magnetic field signal.

* * * * *